United States Patent
Burov et al.

(10) Patent No.: US 12,406,197 B2
(45) Date of Patent: Sep. 2, 2025

(54) PREDICTION AND METROLOGY OF STOCHASTIC PHOTORESIST THICKNESS DEFECTS

(71) Applicant: KLA Corporation, Milpitas, CA (US)

(72) Inventors: Anatoly Burov, Austin, TX (US); Guy Parsey, Ann Arbor, MI (US); Kunlun Bai, Campbell, CA (US); Pradeep Vukkadala, Santa Clara, CA (US); Cao Zhang, Ann Arbor, MI (US); John S. Graves, Austin, TX (US); Xiaohan Li, Ann Arbor, MI (US); Craig Higgins, Cedar Park, TX (US)

(73) Assignee: KLA Corporation, Milpitas, CA (US)

(*) Notice: Subject to any disclaimer, the term of this patent is extended or adjusted under 35 U.S.C. 154(b) by 1052 days.

(21) Appl. No.: 17/337,373

(22) Filed: Jun. 2, 2021

(65) Prior Publication Data

US 2022/0129775 A1  Apr. 28, 2022

Related U.S. Application Data

(60) Provisional application No. 63/106,356, filed on Oct. 28, 2020.

(51) Int. Cl.
| | | |
|---|---|---|
| *G03F 7/00* | (2006.01) | |
| *G03F 1/70* | (2012.01) | |
| *G06N 7/01* | (2023.01) | |
| *G06N 20/00* | (2019.01) | |

(52) U.S. Cl.
CPC .............. *G06N 7/01* (2023.01); *G03F 1/70* (2013.01); *G06N 20/00* (2019.01)

(58) Field of Classification Search
CPC .......... G06N 7/01; G06N 20/00; G06N 3/045; G06N 3/048; G06N 3/082; G06N 20/20; G03F 1/70; G03F 7/705; G03F 7/70608
See application file for complete search history.

(56) References Cited

U.S. PATENT DOCUMENTS

| | | |
|---|---|---|
| 7,235,336 B1 | 6/2007 | Gu |
| 10,545,411 B2 | 1/2020 | Hansen |
| 10,795,267 B2 | 10/2020 | Hansen |
| 12,122,053 B2 * | 10/2024 | Chen .................... G06N 3/08 |

(Continued)

FOREIGN PATENT DOCUMENTS

| | | |
|---|---|---|
| TW | 200525674 A | 8/2005 |
| WO | 2019162346 A1 | 8/2019 |
| WO | 2019238372 A1 | 12/2019 |

OTHER PUBLICATIONS

Ye et al., Tempo: Fast Mask Topography Effect Modeling with Deep Learning, Sep. 20-23, 2020, ISPD, pp. 127-1334 (Year: 2020).*

(Continued)

*Primary Examiner* — Nghia M Doan
(74) *Attorney, Agent, or Firm* — Hodgson Russ LLP

(57) ABSTRACT

A mask pattern for a semiconductor device can be used as an input to determine a photoresist thickness probability distribution using a machine learning module. For example, the machine learning module can determine a probability map of Z-height. This can be used to determine stochastic variation in photoresist thickness for a semiconductor device. The Z-height may be calculated at a coordinate in the X-direction and Y-direction.

19 Claims, 2 Drawing Sheets

(56) References Cited

U.S. PATENT DOCUMENTS

| | | | |
|---|---|---|---|
| 2004/0017574 A1* | 1/2004 | Vuong | G03F 7/70625 |
| | | | 356/625 |
| 2006/0199286 A1 | 9/2006 | Sato | |
| 2008/0243730 A1 | 10/2008 | Bischoff et al. | |
| 2019/0196334 A1* | 6/2019 | Tel | G03F 7/70625 |
| 2021/0216697 A1* | 7/2021 | Van Den Brink | G06F 30/398 |

OTHER PUBLICATIONS

Kim, et al., "Modeling with Thin Film Thickness using Machine Learning", Journal of the Semiconductor & Display Technology, Jun. 30, 2019, pp. 48-52, vol. 18, Issue 2, KoreaScience.

WIPO, International Search Report for International Application No. PCT/US2021/054645, Feb. 3, 2022.

Wang et al., "Assessment of pattern variability and defectivity by large-scale SEM metrology with >100 million measurements", Journal of Micro/Nanolithography, MEMS, and MOEMS, Aug. 17, 2018, pp. 041007: 1- 10, vol. 17, Issue 4, SPIE Digital Library.

Pret et al., "Comparative stochastic process variation bands for N7, N5, and N3 at EUV", Proceedings, Extreme Ultra Violet Lithography IX, Mar. 19, 2018, pp. 105830K:1-11, vol. 10583, SPIE Digital Library.

De Schepper et al., "Population statistics of EUV printed MOx resist features", Proceedings, Extreme Ultra Violet Lithography IX, Mar. 19, 2018, vol. 10583, Abstract, SPIE Digital Library.

Church et al., Fundamental Characterization of Stochastic Variation for Improved Single-Expose Extreme Ultraviolet Patterning at Aggressive Pitch, J. Micro/Nanolith., 2020, vol. 19(3), 034001.

* cited by examiner

PREDICTION AND METROLOGY OF STOCHASTIC PHOTORESIST THICKNESS DEFECTS

CROSS-REFERENCE TO RELATED APPLICATIONS

This application claims priority to the provisional patent application filed Oct. 28, 2020 and assigned U.S. App. No. 63/106,356, the disclosure of which is hereby incorporated by reference.

FIELD OF THE DISCLOSURE

This disclosure relates to metrology of photoresist on semiconductor wafers.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it maximizes return-on-investment for a semiconductor manufacturer.

A lithographic projection apparatus can be used in the manufacture of integrated circuits (ICs). In such a case, a patterning device (e.g., a mask) may provide a circuit pattern corresponding to an individual layer of the IC ("design layout"), and this circuit pattern can be transferred onto a target portion (e.g., comprising one or more dies) on a wafer coated with a layer of radiation-sensitive photoresist by methods such as irradiating the target portion through the circuit pattern on the patterning device. In general, a single wafer contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one exposure, which is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device.

Prior to transferring the circuit pattern from the patterning device to the wafer, the wafer may undergo various procedures, such as priming, photoresist coating, and a soft bake. After exposure, the wafer may be subjected to other procedures, such as a post-exposure bake (PEB), development, a hard bake, and measurement/inspection of the transferred circuit pattern. These procedures are used to make an individual layer of a device (e.g., an IC). The wafer may then undergo various processes such as etching, ion-implantation (doping), metallization, oxidation, chemical mechanical polishing, all intended to form the individual layer of the device. If several layers are required in the device, then the whole procedure, or a variant thereof, is repeated for each layer. Eventually, a device will be present in each target portion on the wafer. These devices are then separated from one another by a technique such as dicing or sawing, and the individual devices can be mounted on a carrier, connected to pins, etc.

Patterns formed on wafers via lithography define functional elements of the ICs, such as microprocessors, memory chips, etc. Similar lithographic techniques are also used in the formation of flat panel displays, micro-electro mechanical systems (MEMS), or other devices.

As semiconductor manufacturing processes continue to advance, the dimensions of functional elements have continually been reduced while the amount of functional elements, such as transistors, per device has been steadily increasing. At the current state of technology, layers of devices are manufactured using lithographic projection apparatuses that project a design layout onto a substrate using illumination from an illumination source, creating individual functional elements having dimensions well below 100 nm, which can be less than half the wavelength of the radiation from the illumination source (e.g., a 193 nm illumination source).

This process in which features with dimensions smaller than the classical resolution limit of a lithographic projection apparatus are printed, is commonly known as low-k1 lithography, according to the resolution formula $CD=k1 \times \lambda/NA$, where $\lambda$ is the wavelength of radiation employed (currently in most cases 248 nm or 193 nm), NA is the numerical aperture of projection optics in the lithographic projection apparatus, CD is the critical dimension (generally the smallest feature size printed), and k1 is an empirical resolution factor. In general, the smaller k1 the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as optical and process correction) in the design layout, or other methods generally defined as resolution enhancement techniques (RET).

There are many approaches to characterizing expected variations to printed patterns, but many of these approaches are based on a top-down view of the pattern (e.g., polygons or contours that describe the pattern shape in the XY plane). These XY polygons may be extracted from top-down scanning electron microscope (SEM) images or predicted from lithography simulation. For SEM images, an experiment can be performed where focus and dose are varied from their nominal conditions. The measured focus-exposure matrix is then directly reviewed with a critical dimension scanning electron microscope (CDSEM) for a subset of patterns or the wafer is inspected and detected defects are sent to a review SEM (e.g., the process window qualification (PWQ) methodology). Again, this leads to features in the XY plane, and the expected variations are related to focus and dose. The focus and dose curve experiment is performed to determine how robust the lithography process will be in a manufacturing environment. For example, the experimental dose curve is used to approximate variations in wafer reflectivity or dose fluctuations due to photon shot noise. The focus curve is used to approximate variations in wafer height (topography) seen in a manufacturing environment.

The focus-dose perturbation experimental approach described above is not well-suited for stochastic variations arising from shot noise effects because failure events can be rare yet still can be detrimental to yield. This means that a large number of experimental measurements may need to be performed in order to detect part-per-million or part-per-billion failure modes that can then be repaired. The cycle time of defect discovery affects yield improvement, so another approach is needed to maximize return-on-investment.

In lithography simulation, photoresist profile shape is predicted directly at a fixed Z-height above the wafer or the full 3D profile is predicted and the simulated photoresist profile is sliced at a specified Z-height, which leads to the pattern polygons. Similar to the experimental procedure described above, simulations can be performed at a variety of focus and dose settings to determine the robustness to variations seen in manufacturing. This simulation approach is called calculation of process variation bands, or PV bands, when the polygons for a range of focus/dose conditions are overlaid for a specific pattern. Variations in mask dimensions are also commonly included in PV band calculations.

The simulation approach of PV bands can be extended to predict variability due to stochastic variations, but these methods typically focus on predicting the 3-sigma variability of a normal distribution of edge positions. Edge position metrics (e.g., line width roughness, line edge roughness, or circle edge roughness) can be predicted from different characteristics of the design (e.g., dose, image log slope). The dose sensitivity of the nominal pattern also can be used to predict the stochastic variations for the pattern. These models are focused on metrics in the XY plane as well as responses within the XY plane. Since these models assume perturbations to the nominal case to be normally distributed, they are likely to underestimate the probability of extremely rare events. Finally, both the experimental and simulation-based approaches examine patterns defined in the XY plane, which has been shown to have a poor correlation to yield. Line edge roughness, which is a measure of 3-sigma variation of the edge of a line pattern, does not typically correlate with electrical yield.

There has been a long felt need for a full-chip model capable of prediction of probability of rare events arising from stochastic nature of photoresist exposure and facilitates rapid defect discovery, leading to better yield control. Therefore, improved techniques for photoresist stochastic modeling are needed.

BRIEF SUMMARY OF THE DISCLOSURE

A method is provided in a first embodiment. The method comprises inputting a mask pattern for a semiconductor device into a machine learning module and determining a photoresist thickness probability distribution for the semiconductor device based on the mask pattern.

The machine learning module can be configured to operate a general linear model, a neural network, a Bayesian inference, a Bayesian neural network, a deep neural network, a convolutional neural network, or a support vector machine.

The machine learning module can be further configured to determine a probability map of photoresist thickness.

The thickness probability distribution can provide photoresist thickness information for a coordinate in the X-direction and Y-direction.

The machine learning module can be further configured to determine a local intensity for a coordinate in the X-direction and Y-direction.

The machine learning module can be further configured to determine an image contrast, image gradient, image log slope, or normalized image log slope for a coordinate in the X-direction and Y-direction.

The thickness probability distribution can be determined to approximately 1 ppb accuracy level.

In an instance, the machine learning module includes a first model, a second model, and a third model. A first model predicts a mask diffraction pattern given a rasterized mask image. A second model predicts an image in photoresist given the mask diffraction pattern. A third model predicts photoresist thickness distribution given the image in photoresist.

A computer program product comprising a non-transitory computer readable storage medium having a computer readable program embodied therewith can be configured to carry out the method of the first embodiment.

A system is provided in a second embodiment. The system includes a machine learning module operable using a processor. The machine learning module is configured to determine a photoresist thickness probability distribution for a semiconductor device based on a mask pattern.

The machine learning module can be configured to operate a general linear model, a neural network, a Bayesian inference, a Bayesian neural network, a deep neural network, a convolutional neural network, or a support vector machine.

The machine learning module can be further configured to determine a probability map of photoresist thickness.

The thickness probability distribution can provide photoresist thickness information for a coordinate in the X-direction and Y-direction.

The machine learning module can be further configured to determine a local intensity, an image contrast, an image gradient, an image log slope, or a normalized image log slope for a coordinate in the X-direction and Y-direction.

The thickness probability distribution can be determined to approximately 1 ppb of photoresist.

In an instance, the machine learning module includes a first model, a second model, and a third model. A first model predicts a mask diffraction pattern given a rasterized mask image. A second model predicts an image in photoresist given the mask diffraction pattern. A third model predicts photoresist thickness distribution given the image in photoresist.

The machine learning module can be in electronic communication with an imaging system that includes an energy source and a detector.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 1:
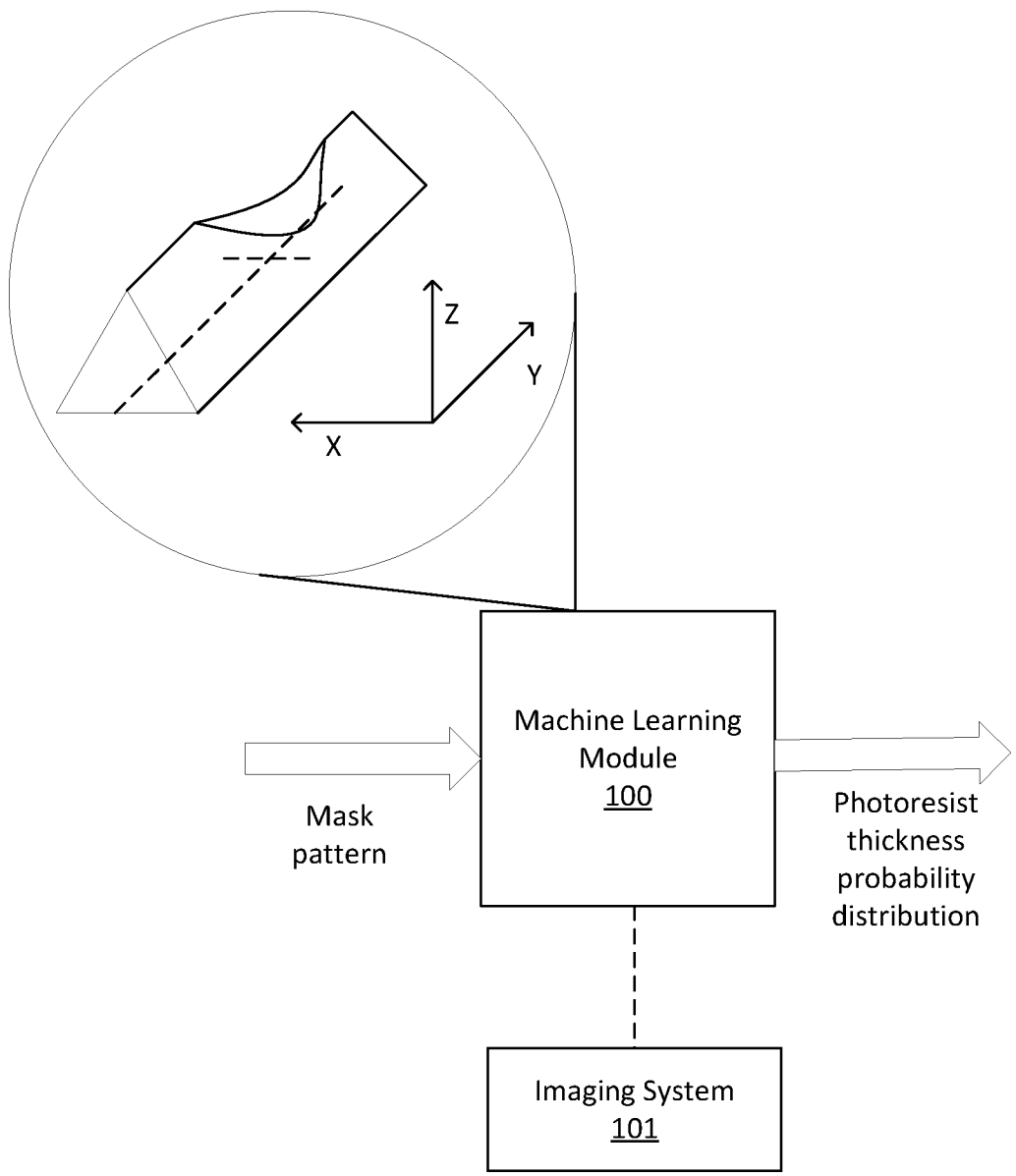
FIG. 1 is a diagram of an embodiment in accordance with the present disclosure.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Photolithography can have defects driven by the quantized nature of light and materials. For example, light is quantized into photons, and the chemical reactants in photoresist are discrete molecules. These are often called shot noise defects or stochastic defects. These stochastic defects can be prevalent for EUV lithography, but can appear at exposure wavelengths used in other lithographic processes such as ArF immersion. "Stochastic" means that the average behavior may be within desired specification (e.g., photoresist width, tip-to-tip measurement for line-ends, or photoresist thickness) while simultaneously exhibiting fluctuations that cause the pattern to fail (e.g., bridging or breaking for a line/space pattern) with a non-zero probability. Given that a wafer includes billions of transistors, even very small failure probabilities can lead to substantial yield loss.

Stochastic failures are often found with an inspection tool and then characterized by a top-down SEM. Inspection and characterization may happen after lithography (after develop inspection (ADI)) or after a subsequent etch and clean step (after etch inspection, (AEI) or after clean inspection (ACI)). The AEI/ACI result can be the most relevant to yield and depends on the remaining photoresist thickness at ADI.

Embodiments disclosed herein can predict these defects with a model of the local photoresist thickness so that full chip layouts can be characterized for stochastic failures. This can be used to predict the stochastic variation in photoresist thickness. Unlike previous techniques, this metric determines photoresist thickness parameters at all locations, including locations of likely failures. The embodiments disclosed herein can analyze photoresist thickness directly at all locations. Photoresist thickness is an indicator of defectivity and yield because of its direct correlation with pattern transfer errors during etch. For example, if unwanted photoresist is found in a space (e.g., a space bridge defect) and the thickness is greater than some threshold, then the etch process will not be able to remove material from the substrate in the space region, as desired. Likewise, if the photoresist is not thick enough in a line region (e.g., a line break defect), then the etch process may remove the remaining photoresist and start to remove material from the substrate in the line region, which is not desired. These photoresist thickness errors will cause pattern transfer errors regardless of whether an edge (as defined in the XY plane) is nearby or not.

The local photoresist thickness can be characterized with a simulator, such as PROLITH, which is a physics-based simulator sold by KLA Corporation. This can be in the form of single instances or accumulated histograms over many simulations to determine the probability distribution associated with the photoresist thickness. A physics-based model of the lithographic process can be developed, using methods like PROLITH. A simulator like PROLITH can be used to simulate stochastic events due to photon and chemical shot noise. This is typically performed by a Monte Carlo type process that randomly samples known distributions, such as the Poisson distribution for the absorbance of photons. Multiple simulations can be performed to generate a sample of events for a given set of lithography conditions. A simulated response, such as width of a line or diameter of a contact hole, can be binned into a histogram to represent the probability of the occurrence. These probability distributions of responses from such physics-based simulators have been shown to agree with experimentally-determined results.

A machine learning module 100 is shown in FIG. 1. The machine learning module 100 is configured to determine a photoresist thickness probability distribution for a semiconductor device based on a mask pattern. The machine learning module 100 can be configured to operate a supervised machine-learning model that includes, but is not limited to, a general linear model, a neural network, a Bayesian inference, a Bayesian neural network, a deep neural network, a convolutional neural network, or a support vector machine. Convolutional neural networks can be used for image inputs. Bayesian neural networks can be used to determine probability or distribution as output.

The machine learning module 100 can be trained using the results from the simulator. A dataset may be a collection of mask patterns, which can include approximately 2000 in count and approximately 1 µm in size. In an instance, intermediate data from simulators can be used to train the machine learning module 100. This intermediate data can be used to make three separate models that can be chained during prediction. Thus, simulations can be run with additional variations of common lithography parameters like exposure dose and focus settings to produce intermediate results to train three models (e.g., models A, B, and C).

The model used by the machine learning module 100 can determine various properties near a region of interest. For example, the inset of FIG. 1, includes an exemplary photoresist line. The photoresist line includes a defect that may cause problems during later etching steps. Various properties can be determined at a region of interest, which can be positioned at or around a coordinate in the X-direction and Y-direction. Properties also can be determined in an aerial image or image in the photoresist. An image in photoresist is an optical image inside photoresist that is formed during exposure, which can be a result of an intermediate calculation and can be an output of one of the three models (e.g., model B). It can be stored as light intensity at sampled X, Y, and Z locations in the simulation domain. It can be the starting data for later chemical reaction that produce a relief image or the actual physical shape of photoresist after development.

Figure 2:
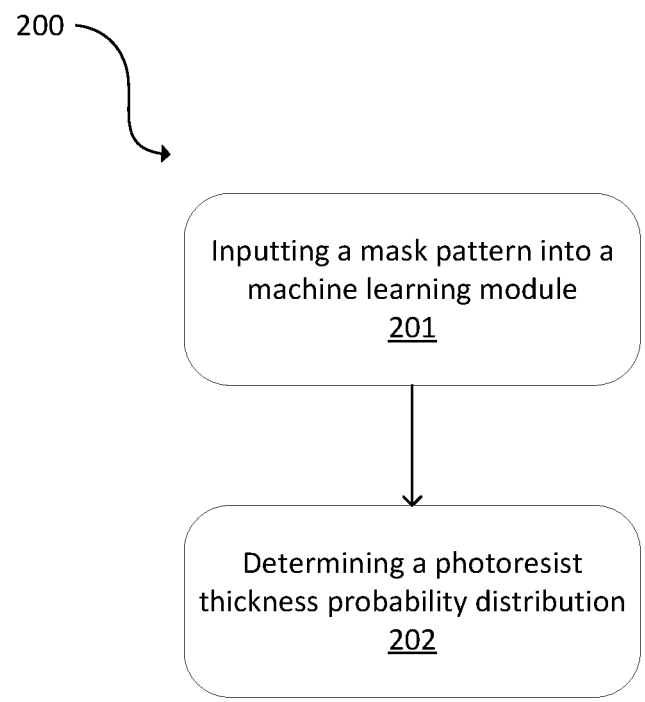
FIG. 2 is a flowchart of a method in accordance with the present disclosure.

FIG. 2 is a flowchart of a method 200. At 201, a mask pattern for a semiconductor device is inputted into a machine learning module. A mask pattern can be thought of as a polygon shape representing intent of a chip designer. It can be stored in various file types, such as a design file. For actual machine learning training, it can be converted to raster format (a table of values) in X and Y dimensions.

The machine learning module may be the machine learning module 100 of FIG. 1. At 202, a photoresist thickness probability distribution is determined for the semiconductor device based on the mask pattern. A probability distribution is the mathematical function that gives the probabilities of occurrence of different levels of photoresist thickness. Practically, it means that the model outputs several values (e.g., count between 2 and 15) of parameters that go into the function that defines the distribution. During model C training, a maximum likelihood principle can be applied to "teach" the model to produce correct parameters for the probability distribution. Just as in any other machine learning process, model output (i.e., distribution) can be evaluated for correctness by comparing to "true" output (e.g., simulator photoresist relief) using a likelihood metric.

The machine learning module can be further configured to determine a probability map of Z-height, such as at a coordinate in the X-direction and Y-direction. A probability map is a surface representing probability of an event at every XY location. In an instance, it is calculated using the distribution that the model predicts. Probability that photoresist height at a position X,Y is higher or lower than a threshold can be predicted. In places where low photoresist thickness is expected (spaces), even a low probability of having some thickness higher than a threshold is a sign of a potential (bridge-type) defect. Conversely, in places where high photoresist thickness is expected (lines), probability of having thickness lower than a threshold (too low) is an indication of a potential line-break defect. This is illustrated in the subset of FIG. 1, where the thickness in the Z-direction is not even. These probabilities are calculated on a dense grid in X,Y, covering full area under test or a full chip. The probability map can represent Z-height of photoresist surface and photoresist thickness.

The thickness probability distribution can provide Z-height information for a coordinate in the X-direction and Y-direction. The thickness probability distribution can be determined to approximately 1 ppb of accuracy level. 1 ppb represents $10^{-9}$ probability, which is a goal for model useful range and accuracy. The goal may decrease to lower levels such as $10^{-10}$, $10^{-11}$, etc. Volume of photoresist in a particular area also can be determined. Characterizing the photoresist thickness provides advantages over merely characterizing edge placement errors, such as the edge placement errors typically outputted by optical proximity correction (OPC) and OPC verification software.

The statistical properties of the photoresist thickness in the Z-direction (i.e., Z-height) can be determined at a coordinate in the X-direction and Y-direction. Thus, thickness of the photoresist in the Z-direction can be determined at a discrete point of a photoresist structure or along a length of a photoresist structure. If the model is partitioned into A, B, and C parts, the steps can include predicting a mask diffraction pattern using model A given a rasterized mask image and optionally with other imaging parameters (e.g., chief ray angle, etc.). Then an image in photoresist is predicted using model B given the mask diffraction pattern optionally with defocus and other imaging parameters (e.g., chief ray angle, flare, aberrations, etc.). Then photoresist thickness distribution parameters are predicted using model C given the image in photoresist optionally with exposure dose and other exposure and photoresist parameters. Using thresholds, a probability of photoresist thickness being too low or too high can be predicted.

This method can be used to search for lithographic defects. Z-direction thickness tends to be more directly related to infrequent lithography defects that limit yield. Areas of interest can be identified as locations where there is intent to have no photoresist (e.g., near center of space) or to have high amount of photoresist (e.g., near center of lines). Probability of photoresist thickness to be too high or too low at these locations can be analyzed and reported. In an instance, Z-direction thickness can be characterized to a probability of approximately 1 ppb, but not limited to 1 ppb accuracy level in areas which should be completely cleared of photoresist. In another instance, Z-direction thickness can be characterized to probability of approximately 1 ppb, but not limited to 1 ppb accuracy level in areas which should contain the full thickness of photoresist. In yet another instance, Z-direction thickness can be characterized to probability of approximately 1 ppb, but not limited to 1 ppb accuracy level in any arbitrary area.

Other properties can be determined at a coordinate in the X-direction and Y-direction, which can be properties of the image in photoresist that are determined before Z-height. These properties include a local intensity, an image contrast, an image gradient, an image log slope, a normalized image log slope, a probability of position of a photoresist edge, or other properties.

Embodiments disclosed herein can be used to find defects in the photoresist. Embodiments disclosed herein also can be used to correct a mask to avoid defects in the photoresist. Thus, results using the method can be used as a form a feedback for mask design. Process parameters during photoresist application (e.g., focus) can be modified based on the results using this method.

In FIG. 1, the machine learning module 100 also includes an optional imaging system 101 in electronic communication with the machine learning module 100. The imaging system 101 includes an energy source and a detector. The energy source generates energy directed to a wafer. The energy source may be, for example, a light source or an electron source. The detector is configured to detect energy reflected from the wafer to generate an image. The energy can be, for example, a beam of light, an electron beam, an ion beam, or another type of particle beam. For example, an optical inspection system or an SEM can provide continuous feedback to the machine learning module 100 by measuring photoresist samples on one or more wafers.

The imaging system 101 or the processor in the imaging system 101 can be configured to transmit the image of the wafer to the machine learning module 100. The image can be used for additional training of the model operated by the machine learning module 100. Thus, a wafer created using information from the machine learning module 100 can be used to further teach or reinforce the machine learning module 100. Other sample wafers or other production wafers also can be used to further teach or reinforce the machine learning module 100.

The machine learning module 100 and the sub-systems therein can include a personal computer system, image computer, mainframe computer system, workstation, network appliance, internet appliance, or other device. The machine learning module 100 or sub-system(s) therein may also include any suitable processor known in the art, such as a parallel processor. This processor can be used to operate the model. In an instance, the processor can be or can include a graphics processing unit (GPU). In addition, the sub-system(s) or machine learning module 100 may include a platform with high speed processing and software, either as a standalone or a networked tool. The machine learning module 100 can include or be coupled with a display and user-input device to select the desired process parameter.

In some embodiments, various steps, functions, and/or operations of machine learning module 100 and the sub-systems therein and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor (or computer system) or, alternatively, multiple process (or multiple computer systems). Moreover, different sub-systems of the neural network module 101 may include one or more computing or logic systems. Therefore, the above description should not be interpreted as a limitation on the present disclosure but merely an illustration.

A convolutional neural network (CNN) can be used in the machine learning module 100 in an embodiment. A CNN is a type of feed-forward artificial neural network in which the connectivity pattern between its neurons (i.e., pixel clusters) is inspired by the organization of the animal visual cortex. Individual cortical neurons respond to stimuli in a restricted region of space known as the receptive field. The receptive fields of different neurons partially overlap such that they tile the visual field. The response of an individual neuron to stimuli within its receptive field can be approximated mathematically by a convolution operation.

CNNs may comprise of multiple layers of receptive fields. These are small neuron collections which process portions of the input image or images. The outputs of these collections are then tiled so that their input regions overlap to obtain a better representation of the original image. This may be repeated for every such layer. Tiling allows CNNs to tolerate translation of the input image. CNN may have a 3D volumes of neurons. The layers of a CNN may have neurons arranged in three dimensions: width, height, and depth. The neurons inside a layer are only connected to a small region of the layer before it, called a receptive field. Distinct types of layers, both locally and completely connected, are stacked to form a CNN architecture. CNNs exploit spatially local correlation by enforcing a local connectivity pattern between neurons of adjacent layers. The architecture can ensure that the learnt filters produce the strongest response to a spatially local input pattern. Stacking many such layers leads to non-linear filters that become increasingly global (i.e., responsive to a larger region of pixel space). This allows the network to first create good representations of small parts of the input, then assemble representations of larger areas from them. In CNNs, each filter is replicated across the entire visual field. These replicated units share the same parameterization (weight vector and bias) and form a feature map. This means that all the neurons in a given convolutional layer detect exactly the same feature. Replicating units in this way allows for features to be detected regardless of their position in the visual field, thus constituting the property of translation invariance.

Together, these properties can allow CNNs to achieve better generalization on imaging problems. Weight sharing also helps by reducing the number of free parameters being learnt, thus lowering the memory requirements for running the network. Decreasing the memory footprint allows the training of larger, more powerful networks. CNNs may include local or global pooling layers, which combine the outputs of neuron clusters. Pooling layers may also consist of various combinations of convolutional and fully connected layers, with pointwise nonlinearity applied at the end of or after each layer. A convolution operation on small regions of input is introduced to reduce the number of free parameters and improve generalization. One advantage of convolutional networks is the use of shared weight in convolutional layers, which means that the same filter (weights bank) is used for each pixel in the layer. This also reduces memory footprint and improves performance.

A CNN architecture may be formed by a stack of distinct layers that transform the input volume into an output volume (e.g., holding class scores) through a differentiable function. A few distinct types of layers may be used. The convolutional layer has a variety of parameters that consist of a set of learnable filters (or kernels), which have a small receptive field, but extend through the full depth of the input volume. During the forward pass, each filter may be convolved across the width and height of the input volume, computing the dot product between the entries of the filter and the input and producing a two-dimensional activation map of that filter. As a result, the network learns filters that activate when they see some specific type of feature at some spatial position in the input. By stacking the activation maps for all filters along the depth dimension, a full output volume of the convolution layer is formed. Every entry in the output volume also can be interpreted as an output of a neuron that looks at a small region in the input and shares parameters with neurons in the same activation map.

When dealing with high-dimensional inputs such as images, it may be impractical to connect neurons to all neurons in the previous volume because such a network architecture does not take the spatial structure of the data into account. CNNs may exploit spatially local correlation by enforcing a local connectivity pattern between neurons of adjacent layers. For example, each neuron is connected to only a small region of the input volume. The extent of this connectivity is a hyperparameter called the receptive field of the neuron. The connections may be local in space (along width and height), but can extend along the entire depth of the input volume. Such an architecture can ensure that the learnt filters produce the strongest response to a spatially local input pattern. In one embodiment, training the CNN includes using transfer learning to create hyperparameters for each CNN. Transfer learning may include training a CNN on a very large dataset and then use the trained CNN weights either as an initialization or a fixed feature extractor for the task of interest.

For example, three hyperparameters can control the size of the output volume of the convolutional layer: the depth, stride and padding size/type. Depth of the output volume controls the number of neurons in the layer that connect to the same region of the input volume. All of these neurons will learn to activate for different features in the input. For example, if the first CNN layer takes the raw image as input, then different neurons along the depth dimension may activate in the presence of various oriented edges, or blobs of color. Stride controls how depth columns around the spatial dimensions (width and height) are allocated. When the stride is one, a new depth column of neurons is allocated to spatial positions only one spatial unit apart. This leads to heavily overlapping receptive fields between the columns, and also to large output volumes. Conversely, if higher strides are used then the receptive fields will overlap less and the resulting output volume will have smaller dimensions spatially. Sometimes it is convenient to pad the input with zeros on the border of the input volume. The size of this zero-padding is a third hyperparameter. Padding provides control of the output volume spatial size. In particular, sometimes it is desirable to exactly preserve the spatial size of the input volume.

In some embodiments, a parameter sharing scheme may be used in layers to control the number of free parameters. If one patch feature is useful to compute at some spatial position, then it may also be useful to compute at a different position. In other words, denoting a single two-dimensional slice of depth as a depth slice, neurons in each depth slice may be constrained to use the same weights and bias.

Since all neurons in a single depth slice may share the same parametrization, then the forward pass in each depth slice of the layer can be computed as a convolution of the neuron's weights with the input volume. Therefore, it is common to refer to the sets of weights as a filter (or a kernel), which is convolved with the input. The result of this convolution is an activation map, and the set of activation maps for each different filter are stacked together along the depth dimension to produce the output volume.

Sometimes, parameter sharing may not be effective, for example, when the input images to a CNN have some specific centered structure, in which completely different features are expected to be learned on different spatial locations.

Pooling is another feature of CNNs, which is a form of non-linear down-sampling. There are several non-linear functions to implement pooling among which max pooling is one. Max pooling partitions the input image into a set of non-overlapping rectangles and, for each such sub-region, outputs the maximum. Once a feature has been found, its exact location may not be as important as its rough location relative to other features. The function of the pooling layer may be to progressively reduce the spatial size of the representation to reduce the amount of parameters and computation in the network, and hence to also control overfitting. A pooling layer may be positioned in-between successive cony layers in a CNN architecture.

Another layer in a CNN may be a ReLU (Rectified Linear Units) layer. This is a layer of neurons that applies a non-saturating activation function. A ReLU layer may increase the nonlinear properties of the decision function and of the overall network without affecting the receptive fields of the convolution layer.

Finally, after several convolutional and/or max pooling layers, the high-level reasoning in the neural network is completed via fully connected layers. Neurons in a fully connected layer have full connections to all activations in the previous layer. Their activations can be computed with a matrix multiplication followed by a bias offset.

In some embodiments, dropout techniques may be utilized to prevent overfitting. As referred to herein, dropout techniques are a regularization technique for reducing overfitting in neural networks by preventing complex co-adaptations on training data. The term "dropout" refers to dropping out units (both hidden and visible) in a neural network. For example, at each training stage, individual nodes may be either "dropped out" of the CNN with probability 1−p or kept with probability p, so that a reduced CNN remains. In some embodiments, incoming and outgoing edges to a dropped-out node may also be removed. Only the reduced CNN is trained. Removed nodes may then be reinserted into the network with their original weights.

In training stages, the probability a hidden node will be retained (i.e., not dropped) may be approximately 0.5. For input nodes, the retention probability may be higher. By avoiding training all nodes on all training data, dropout decreases overfitting in CNNs and improves the speed of training.

Training data may be inputted to model training (e.g., CNN training), which may be performed in any suitable manner. For example, the model training may include inputting the training data to the CNN and modifying one or more parameters of the model until the output of the model is the same as (or substantially the same as) external validation data. Model training may generate one or more trained models, which may then be sent to model selection, which is performed using validation data. The results that are produced by each one or more trained models for the validation data that is input to the one or more trained models may be compared to the validation data to determine which of the models is the best model. For example, the model that produces results that most closely match the validation data may be selected as the best model. Test data may then be used for model evaluation of the model that is selected (e.g., the best model). Model evaluation may be performed in any suitable manner. Best model may also be sent, to model deployment in which the best model may be sent to the semiconductor inspection tool for use (post-training mode).

Many different types of CNNs may be used in embodiments of the present disclosure. Different CNNs may be used based on certain scanning modes or circumstances. The configuration of a CNN may change based on the simulator configuration, wafer, image data acquisition subsystem, or predetermined parameters.

Other models can be used in the machine learning module 100. For example, a Bayesian neural network is a probabilistic graphical model that represents a set of variables and their conditional dependencies via a directed acyclic graph. Bayesian networks can take an event that occurred and predict the likelihood that any one of several possible known causes was a contributing factor.

An additional embodiment relates to a non-transitory computer-readable medium storing program instructions executable using a processor for performing a computer-implemented method for determining process parameters, as disclosed herein. An electronic data storage unit or other storage medium may contain non-transitory computer-readable medium that includes program instructions executable on the neural network module. The computer-implemented method may include any step(s) of any method(s) described herein, including method 200.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
    inputting a mask pattern for a semiconductor device into a machine learning module, wherein the mask pattern is a design file that includes a polygon shape of a mask; and
    determining a photoresist thickness probability distribution for the semiconductor device based on the mask pattern using the machine learning module, wherein the machine learning module includes a first model, a second model, and a third model, wherein the first model predicts a mask diffraction pattern given a rasterized mask image, wherein the second model predicts an image in photoresist given the mask diffraction pattern, and wherein the third model predicts photoresist thickness distribution given the image in photoresist.

2. The method of claim 1, wherein the machine learning module is configured to operate a general linear model, a neural network, a Bayesian inference, a Bayesian neural network, a deep neural network, a convolutional neural network, or a support vector machine.

3. The method of claim 1, wherein the machine learning module is further configured to determine a probability map of photoresist thickness.

4. The method of claim 1, wherein the thickness probability distribution provides photoresist thickness information for a coordinate in the X-direction and Y-direction.

5. The method of claim 1, wherein the machine learning module is further configured to determine a local intensity for a coordinate in the X-direction and Y-direction.

6. The method of claim 1, wherein the machine learning module is further configured to determine an image contrast for a coordinate in the X-direction and Y-direction.

7. The method of claim 1, wherein the machine learning module is further configured to determine an image gradient for a coordinate in the X-direction and Y-direction.

8. The method of claim 1, wherein the machine learning module is further configured to determine an image log slope for a coordinate in the X-direction and Y-direction.

9. The method of claim 1, wherein the machine learning module is further configured to determine a normalized image log slope for a coordinate in the X-direction and Y-direction.

10. The method of claim 1, wherein the thickness probability distribution is determined to approximately 1 ppb accuracy level.

11. The method of claim 1, further comprising training the machine learning module, wherein the training includes:
generating intermediate data from a simulator using a collection of mask patterns; and
using the intermediate data to train the machine learning module.

12. A computer program product comprising a non-transitory computer readable storage medium having a computer readable program embodied therewith, the computer readable program configured to carry out the method of claim 1.

13. A system comprising:
a machine learning module operable using a processor that is in electronic communication with an imaging system that includes an energy source and a detector, wherein the machine learning module is configured to determine a photoresist thickness probability distribution for a semiconductor device based on a mask pattern using the machine learning module, wherein the mask pattern is a design file that includes a polygon shape of a mask, wherein the machine learning module includes a first model, a second model, and a third model, wherein the first model predicts a mask diffraction pattern given a rasterized mask image, wherein the second model predicts an image in photoresist given the mask diffraction pattern, and wherein the third model predicts photoresist thickness distribution given the image in photoresist.

14. The system of claim 13, wherein the machine learning module is configured to operate a general linear model, a neural network, a Bayesian inference, a Bayesian neural network, a deep neural network, a convolutional neural network, or a support vector machine.

15. The system of claim 13, wherein the machine learning module is further configured to determine a probability map of photoresist thickness.

16. The system of claim 13, wherein the thickness probability distribution provides photoresist thickness information for a coordinate in the X-direction and Y-direction.

17. The system of claim 13, wherein the machine learning module is further configured to determine a local intensity, an image contrast, an image gradient, an image log slope, or a normalized image log slope for a coordinate in the X-direction and Y-direction.

18. The system of claim 13, wherein the thickness probability distribution is determined to approximately 1 ppb of photoresist.

19. The system of claim 13, wherein the machine learning module is trained using intermediate data from a simulator, wherein the intermediate data is generated from a collection of mask patterns.

* * * * *